United States Patent [19]

Höfer et al.

[11] 4,112,427
[45] Sep. 5, 1978

[54] REVERSIBLE ANALOG-TO-DIGITAL CONVERTER

[75] Inventors: Ernst Höfer; Peter Hirschmann; Klaus Wintzer, all of Munich, Fed. Rep. of Germany

[73] Assignee: Siemens Aktiengesellschaft, Munich, Fed. Rep. of Germany

[21] Appl. No.: 715,864

[22] Filed: Aug. 19, 1976

[30] Foreign Application Priority Data

| Aug. 29, 1975 | [DE] | Fed. Rep. of Germany | 2538543 |
| Sep. 30, 1975 | [DE] | Fed. Rep. of Germany | 2543609 |
| Sep. 29, 1975 | [DE] | Fed. Rep. of Germany | 2543390 |
| Nov. 28, 1975 | [DE] | Fed. Rep. of Germany | 2553632 |

[51] Int. Cl.$^2$ ............................................. H03K 13/02
[52] U.S. Cl. .................................. 340/347 C; 179/15 A
[58] Field of Search ............ 179/15 A, 15 BD, 2 DP, 179/2 R, 15 AT; 340/347 C; 178/2, 3

[56] References Cited

U.S. PATENT DOCUMENTS 3,889,063  6/1975  Slavin ........................ 179/15 A

*Primary Examiner*—Charles D. Miller
*Attorney, Agent, or Firm*—Schuyler, Birch, Swindler, McKie & Beckett

[57] ABSTRACT

A method and apparatus for a telecommunication installation is disclosed for converting PAM analog signals into PCM digital signals and vice versa. A conversion circuit which is connected to a telephone station comprises an input register for temporarily storing the incoming PCM digital signals and an output register for temporarily storing the outgoing PCM digital signals. This conversion circuit includes a clock pulse generator which enables a counter to count through all its counter positions upon the appearance of each channel time slot pulse of the incoming PCM channel time slot pulse train. The input register and counter are connected to an intermediate register which in turn is connected to a digital-to-analog converter for converting the incoming PCM digital signal into an analog signal. This analog signal is sent to the receiving unit of the telephone station in a first time interval of the counter. The conversion circuit also comprises an analog comparator which is connected to the transmitting unit of the telephone station for receiving PAM analog signals. This PAM analog signal is converted into a digital signal in the intermediate register during a second time interval of the counter. The converted analog signal is then fed to the output register to be sent to the PCM switching center. Thus, the conversion circuit of this invention is time shared for use in converting both digital and analog signals.

16 Claims, 4 Drawing Figures

REVERSIBLE ANALOG-TO-DIGITAL CONVERTER

BACKGROUND OF THE INVENTION

The invention relates to a method and apparatus for converting PAM analog signals into PCM digital signals and for converting PCM digital signals into PAM analog signals in telecommunication installations having telephone stations. Such a known system is described in commonly assigned U.S. Pat. No. 4,056,820 filed on July 27, 1976, and issued to Hofer on Nov. 1, 1977. The telephone stations each comprise a transmitting unit supplying analog signals and a receiving unit accepting analog signals. The telecommunication installations can be connected to signal receiving units which accept PCM digital signals and signal output units which supply PCM digital signals. As is generally known in the art, the PCM digital signals are in the form of a PCM pulse train having pulses recurring in pulse frames or channel time slots in successive cycles. The telecommunication installation operates for the duration of the pulses of the pulse train, i.e., the channel time slot pulses of the channel time slot pulse train. Associated therewith for the conversion of the analog signals into digital signals is an analog-to-digital converter which is also utilized for receiving a digital signal to be converted into an analog signal. The analog-to-digital converter allocated to the telephone stations works along the iterative principle. The invention employs a counter, an intermediate register controlled by the signals of the counter, a digital-to-analog converter following the intermediate register and a comparator. One input of the comparator is connected to the output of the digital-to-analog converter. Analog signals to be converted into digital signals are applied at another input of the comparator. The comparator is capable of controlling the supply of the counter signals to the intermediate register. The digital signal which is to be converted into an analog signal is intended for the receiving unit of the telephone station. The digital signal is converted during one subinterval of the counter which corresponds to one pulse frame. The analog signal is converted into a digital signal and supplied from the associated transmitting unit of the particular telephone station within another subinterval.

According to the method described hereinabove the counter associated with the analog-to-digital converter is continually operated. Because the analog-to-digital converter is in continuous operation, problems may arise during the conversion of digital signals into analog signals. For example, the counter might operate so fast that the digital-to-analog converter might be activated at the same time another digital signal is already being converted into an analog signal. This could lead to faulty multiple conversions of the digital signals.

It is therefore an object of the invention to provide an easy method for ensuring that a digital signal is converted just once into an analog signal.

SUMMARY OF THE INVENTION

In accordance with the invention, the foregoing and other objects are achieved in that the chanell time slot pulses of a channel time slot pulse train allocated to the telephone station for receiving signals and, where necessary, for supplying signals enable the sharing of the control of the counter of the analog-to-digital converter. To this end, the counter initiates a counting cycle upon the appearance of each such channel time slot pulse of the channel time slot pulse train and during each cycle it passes through all counter positions. Thus, it is easily ensured that each digital signal to be converted into an analog signal is presented just once for conversion.

Another advantage of the invention is that the counter is activated by clock pulses of such a frequency that the duration of the counting cycle is smaller than the duration of channel time slot the pulses of the channel time slot pulse train allocated to said telephone station appear. In this manner it is easily ensured that the counter is in its counter position when the particular digital signal to be converted into an analog signal appears.

According to another advantage of the invention, a control signal is derived from each digital signal to be converted into an analog signal and appearing for the duration of one of the channel time slot pulses of the channel time slot pulse train allocated to said telephone station by means of a pulse gathering circuit. The control signal supplied is of a given level and is supplied during the interval when said digital signal appears to the set input of a bistable multivibrator. The output signal of the multivibrator has a set status (a "1" level) which is used to control a switch connecting the counter with the output of a clock generator. The reset input of the clock generator receives a reset signal at the end of the counter cycle. Thus, it is ensured that the counter after each execution of a counting cycle remains in a given counter position, that is, the initial counter position. The counter is only taken out of this counter position upon the appearance of a digital signal to be converted into an analog signal.

According to still another advantage of the invention, clock pulses are also supplied from the pulse gathering circuit in response to each digital signal to be converted into an analog signal. The clock pulses are applied to the clock inputs of an input register used for receiving the digital signals and, where necessary, to the clock inputs of an output register provided for the supply of digital signals. Thus, the timing of these registers is easily controlled.

According to still another advantage of the invention, the pulses utilized for the control of the counter are applied over a special control lead independently of the transmission line employed for sending digital signals to the analog-to-digital converter. This results in the advantage that although one has to accept the circuit complexity conditioned by the provision of the transmission line, the channel time slot pulses of the channel time slot pulse train allocated to the associated telephone station for receiving and, where necessary, for delivering signals can in either case, independently of the type of code employed for sending digital signals to be converted into analog signals, bring about the control of the counter of the analog-to-digital converter.

According to another advantage of the invention, in order to control the conversion of analog signals to be supplied from the transmitting unit of the telephone station and to be converted into digital signals when no digital signals to be converted into analog signals appear, a request signal is supplied in the initial phase which calls for the allocation of a channel time slot pulse train and, moreover, the counter of the associated analog-to-digital converter is controlled effectively only upon the appearance of a channel time slot pulse of a pulse channel time slot train allocated to the associated telephone station for the purpose of controlling the conversion processes. This results in the advantage that the counter of the analog-to-digital converter which in the first stage is ready for use is put into operation for converting analog signals into digital signals at a time when — due to the allocation of a channel time slot pulse train with recurring channel time slot pulses in successive cycles — transmission of such digital signals to a signal receiving unit is made possible.

In order to carry out the process described hereinabove, it is convenient to use a switching arrangement having an analog-to-digital converter working along the iterative principle and comprising a counter whose input is connected to the output of a clock generator over a switch which is closed by a pulse gathering circuit for the duration of a counting cycle of the counter and is reopened at the end of the counting cycle upon detection of a channel time slot pulse of a channel time slot pulse train allocated to the telephone station. This switching arrangement is characterized in that there is connected to a circuit leading to the signal receiving unit accepting digital signals a request signal output circuit which supplies a particular prespecified request signal bit sequence. This request signal output circuit is activated by a blocking element which receives at its signal input a "1" signal in the event that the associated telephone station is in the working condition, that is, it is ready to receive and supply analog signals. At the same time, the operating input of the blocking element receives a "0" signal until the switch connected to the output of the clock generator is closed. The advantage is that very little circuit complexity is involved for the output of a request signal. Another advantage is that one easily ensures that the allocation of a channel time slot pulse train with recurring channel time slot pulses in successive cycles can only be requested until the telephone station concerned is allocated such a pulse train. This is because the appearance of the first channel time slot pulse of such a channel time slot pulse train inhibits the blocking element which thereby prevents the activation of the request signal output circuit.

According to another advantage of the switching arrangement described hereinabove, the inhibiting input of the blocking element is connected to an output of a bistable circuit whose set input is connected to the operating input of the switch connected to the output of the clock generator. The reset input is connected to another switch associated with the telephone station. A reset signal is applied over this latter switch to the reset input of the bistable circuit in the event that the telephone station is in its idle condition. In this way, it is ensured that when the telephone station is in the operating condition the output of a request signal neither occurs in the time interval between the end of a counting cycle and the start of the following counting cycle of the counter.

According to still another advantage of the invention, a working supply voltage is applied to the analog-to-digital converter and to its associated telephone station only upon the appearance of a special instruction. This instruction is derived from either the appearance of digital signals to be converted into analog signals or the appearance of a signal indicating the switchover of the associated telephone station to the operating condition when it is ready to deliver or receive analog signals. Thus, it is easily ensured that no power is consumed unnecessarily during the intervals when no conversion takes place and the telephone station is in its idle condition.

To carry out the process described hereinabove, it is convenient to use a switching arrangement having an analog-to-digital converter working along the iterative principle, whose counter input is connected to the output of a clock generator over a switch which closes upon the appearance of a channel time slot pulse of a channel time slot pulse train allocated to the associated telephone station and reopens after the execution of a counting cycle. The switching arrangement is characterized in that a control signal delivered by a detector circuit in response to the detection of a particular prespecified signal bit sequence and the "ready-to-operate" signal of the associated telephone station are employed for closing a switch over which the analog-to-digital converter and its associated telephone station are connected to a working voltage generator. This results in the advantage that very little circuit complexity is involved for connecting a supply voltage to the analog-to-digital converter and to the telephone station associated with said converter in the case of the appearance of digital signals to be converted into analog signals and/or analog signals to be converted into digital signals.

According to an advantage of the switching arrangement described hereinabove, the detector circuit is connected to the particular input of the analog-to-digital converter designed for the acceptance of digital signals to be converted into analog signals and, moreover, it is continually connected to the working supply voltage generator. In this manner, a control signal can be derived with very little circuit complexity from the particular prespecified call signal bit sequence.

According to another advantage of the invention, the operating input of the switch connecting the analog-to-digital converter and the telephone station associated therewith to the working supply voltage generator is connected to an output of a bistable circuit. The set input of this bistable circuit can be controlled by the control signal supplied by the detector circuit and by the "ready-to-operate" signal of the associated telephone station. The reset input is supplied with a reset signal from the associated telephone station in the event that the associated telephone station is switched over from the operating to the idle condition. The advantage is that the operating voltage supply of the analog-to-digital converter and of the associated telephone station is available during the conversion time without the necessity of complex circuitry.

DETAILED DESCRIPTION OF THE INVENTION

Figure 1:
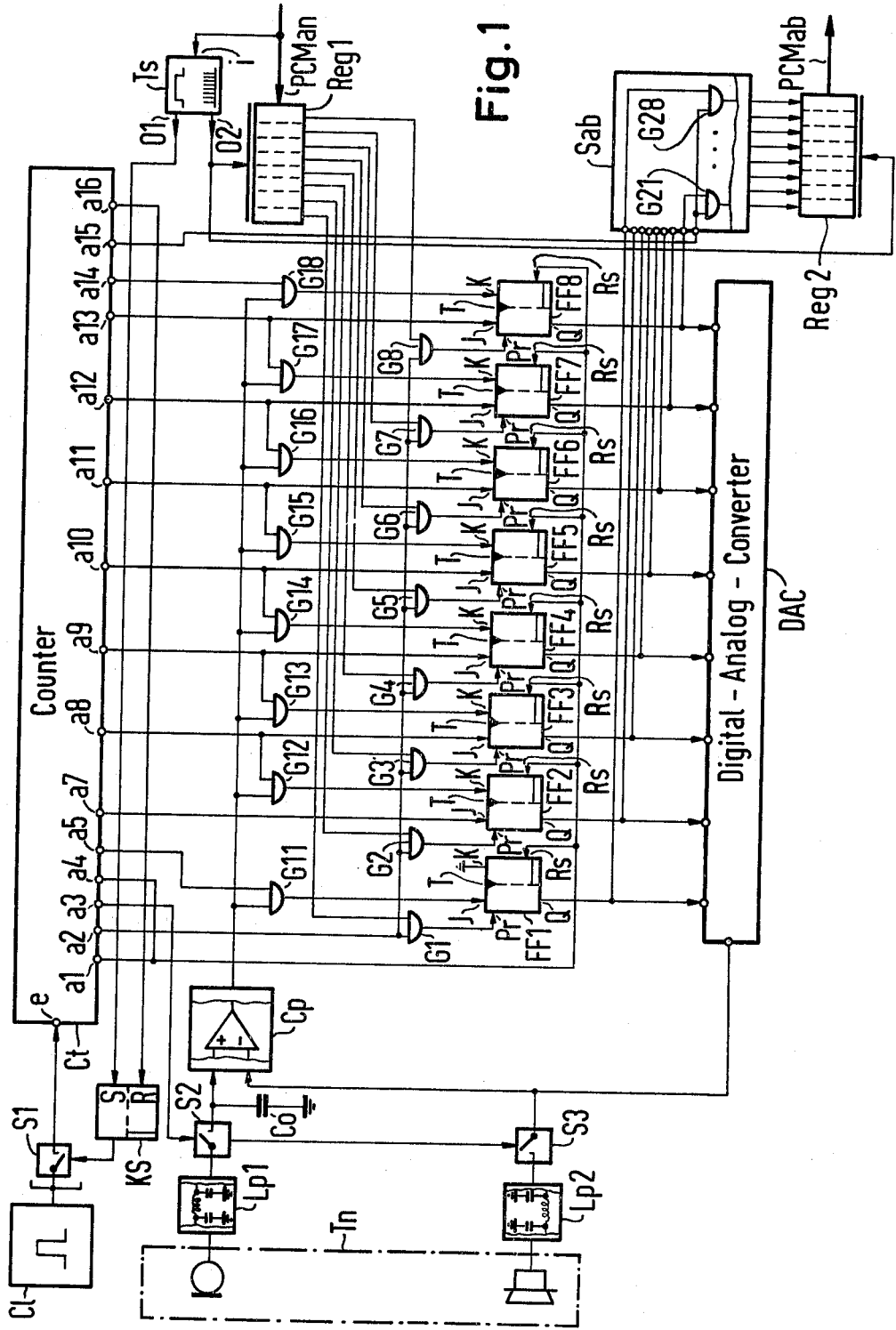
FIG. 1 is a switching arrangement for carrying out the invention.

FIG. 1 shows schematically a telephone station Tn having a transmitting unit illustrated in the upper part of the figure and a receiving unit in the lower part thereof. The telephone station Tn, which may particularly be a telephone station of a PCM time division multiplex telephone switching system, is connected with its transmitting unit to a capacitor Co over a low-pass filter Lp1 and a switch S2. One input of the comparator Cp, which is an analog comparator, is connected to the capacitor Co. The comparator Cp may, for example, comprise a differential amplifier connected with its noninverting input (+) to the capacitor Co. The comparator Cp is connected with another input to the output of a digital-to-analog converter DAC. The inverting input (−) of the differential amplifier may be connected to the other input of comparator Cp.

One input of each of the logic AND elements G11 to G18 is connected to the output of the comparator Cp. To a certain extent, the inputs of the AND elements G11 to G18 are tripping inputs. The other inputs of the AND elements G11 to G18 are connected to outputs a5, a7, a8, a9, a10, a11, a12, a13 or a14 of a counter Ct. In the present case, the counter Ct is a 16-stage 1-out-of-n counter. The output of the AND elements G11 to G18 is connected to one input of each of bistable multivibrators FF1 to FF8. The bistable multivibrators FF1 to FF8 form register stages of an intermediate register. The bistable multivibrators FF1 to FF8 may be conventional JK bistable elements; they each have control inputs J and K, a clock pulse input T, a set input Pr and a reset input Rs, as well as an output Q.

Of the AND elements G11 to G18, the output of the AND element G11 is connected to the J input of the bistable multivibrator FF1, while the outputs of the other AND elements G12 to G18 are connected to the K inputs of the bistable multivibrators FF2 to FF8. The K input of the bistable multivibrator FF1 is connected to ground. The J inputs of the bistable multivibrators FF2 to FF8 are connected directly to the outputs a7 to a13 of the counter Ct. The clock pulse inputs T of the bistable multivibrators FF1 to FF8 are connected to the output of a clock generator C1, preferably over the switch S1. This is not shown in the drawing. The set inputs Pr of the bistable multivibrators FF1 to FF8 are connected to the outputs of other logic elements G1 to G8 which may likewise be made up of AND elements. The first inputs of each of the AND elements G1 to G8 are connected together to an output a2 of the counter Ct. The other inputs of the AND elements G1 to G8 are connected to the outputs of the register stages of an input register Reg1 which is connected at the input end to a circuit PCMan over which digital signals to be converted into analog signals are applied from a signal output device to the input register Reg1. In the present case, they may be PCM signals. Accordingly, the input register Reg1 has a number of register stages corresponding to the number of bits making up a PCM word. The AND elements G1 to G8 are connected with their aforesaid other inputs to the outputs of register stages of the input register Reg1 such that the sequence of significance of the individual bits of the digital signal to be converted is duly considered in the course of the digital-to-analog conversion to be effected. The bistable multivibrators FF1 to FF8 are all connected with their reset inputs Rs to a counter output a1 and a counter output a4 of the counter Ct.

The outputs Q of the bistable multivibrators FF1 to FF8 are connected to separate inputs of the digital-to-analog converter DAC. It is an object of the digital-to-analog converter DAC to supply — in response to the code chain applied thereto — a corresponding analog output signal. To this end, the digital-to-analog converter may be formed by a conventional R-2R network, wherein constant currents from separate constant current generators may be applied to the junction points of the individual resistors provided, said constant current generators capable of being controlled effectively by the bits of the digital signal to be converted in each case. Such a digital-to-analog signal is exemplified by U.S. Pat. No. 3,510,868, FIG. 3; it is capable of converting the digital signal applied thereto into a corresponding analog signal using a nonlinear curve characteristic.

One input of each of the logic elements G21 to G28, which may likewise be made up of AND elements, is connected to the Q outputs of the bistable multivibrators FF1 to FF8. The other input of each of the AND elements G21 to G28 is connected to an output a15 of the counter Ct. The outputs of the AND elements G21 to G28 are connected to the inputs of a register stage of an output register Reg2. The Q outputs of the bistable multivibrators FF1 to FF8 are connected to the inputs of the output register Reg2 in such a sequence that the bits of the digital signals supplied by said output register Reg2 occur in the same sequence of significance in which appear the bits of digital signals applied to the input register Reg1. The output register Reg2 which has a number of register stages corresponding to the number of bits making up a digital signal is connected at the output end to a circuit PCMab, over which digital signals can be delivered to a signal receiving unit similar to the switching arrangement under consideration. In the present case, the digital signals may be PCM signals. The aforementioned AND elements G21 to G28, which are only actuated for transmission at specified times, are associated with a signal output circuit Sab.

The receiving unit of the telephone station Tn described hereinabove is connected to the output of the digital-to-analog converter DAC over a low-pass filter Lp2 and a switch S3. The input of the switch S3 and the input of the switch S2 are connected to an output a3 of the counter Ct. The counter inpute of counter Ct is connected through a switch S1 to the output of the clock generator C1. The operating input of the switch S1 is connected to the output of a bistable multivibrator KS, that is, to the output which emits a "1" signal closing the switch S1 during the set status of said bistable multivibrator KS. The set input S of the bistable multivibrator KS is connected to an output 01 of a pulse gathering circuit Ts. The reset input R of the bistable multivibrator KS is connected to an output a16 of the counter Ct. The output a16 of the counter Ct emits a "1" signal at the end of each counting cycle, as will be described hereinbelow. The input of the pulse gathering circuit Ts is connected to the circuit PCMan, over which digital signals to be converted into analog signals are applied to the input register Reg1. In the present case, digital signals occur throughout the duration of intervals defined by channel time slot pulses of a channel time slot pulse train which is allocated to the telephone station at least for the duration of a signal transmission associated with the switching arrangement under consideration. In other words, the channel time slot pulses of the channel time slot pulse train allocated to the telephone station Tn for a signal reception/delivery are to a certain extent modulated with the digital signals appearing on the circuit PCMan.

The control signal appearing at the output o1 of the pulse gathering circuit Ts has a "1" signal level during the interval when the digital signal appears on the circuit PCMan. The pulse gathering circuit Ts emits clock pulses at another output o2 in response to the appearance of the digital signal at the input thereof. The number of clock pulses emitted by the output $o2$ of the pulse gathering circuit $Ts$ in response to the appearance of a digital signal corresponds to the number of bits making up the digital signal. The clock pulses are applied to the clock inputs of the input register Reg1 and the output register Reg2. In the case of the input register Reg1 the clock pulses concerned cause the bits of each digital signal appearing on the circuit PCMan to be introduced into the input register Reg1 in the rhythm of the clock pulses. In the case of the output register Reg2, the clock pulses cause the bits of the digital signal situated therein to be emitted to the circuit PCMab in the rhythm of the clock pulses.

The switching arrangement considered hereinabove comprising the counter $Ct$, the intermediate register comprising the bistable multivibrators FF1 to FF8, the digital-to-analog converter DAC following said intermediate register and the comparator $Cp$ with one input connected to the output of the digital-to-analog converter DAC and the other input connected to receive the analog signals for conversion into digital signals and which allows at the output end the control of the output of the counter signals to the intermediate register over the logic elements G11 to G18 is an analog-to-digital converter working along the iterative principle. In the telecommunication system, the analog-to-digital converter is assigned to individual subscribers.

The operation of the switching arrangement shown in FIG. 1 will now be discussed.

First, it must be pointed out that the clock repetition rate of the clock pulses emitted by the clock generator C1 and the construction of the counter $Ct$ are so selected that during use counter output signals appear in a particular cycle at the individual counter outputs. This counting cycle will hereinafter be referred to as the cycle in which digital signals appear on the circuits PCMan and PCMab of the telecommunication system. While the digital signals appear on said circuits at a time interval or cycle of e.g., 125 $\mu$s, the counting cycle may have a duration of e.g., 120 $\mu$s. Moreover, the cycle time of 125 $\mu$s corresponds to the pulse frame period in conventional PCM time division multiplex telephone switching systems.

Let it be assumed that a digital signal is applied from a signal output device to the input register Reg1 of the switching arrangement under consideration, said digital signal to be converted into an analog signal to be applied to the telephone station. The bistable multivibrator KS is set as a result of the output of a "1" signal from the output $o1$ of the pulse gathering circuit $Ts$. As a consequence, the switch S1 is closed so that clock pulses now find their way from the output of the clock generator C1 which, moreover, may be utilized for a multiplicity of corresponding switching arrangements, to the counter input $e$ of the counter $Ct$. Prior to the closing of switch S1, the counter $Ct$ is in its initial counter position in which no counter output signal is emitted from any of the outputs shown in the drawing. When switch S1 is closed, a counting cycle is initiated which corresponds to a conversion cycle. During the counting cycle, counter output signals appear one after another at the marked counter outputs $a1$ to $a5$ as well as at $a7$ to $a16$ of the counter $Ct$. The counter output signals in question may appear one after another in a sequence in accordance with the markings of the outputs of the counter $Ct$. Accordingly, a counter output signal will first appear at the counter output $a1$ within each counting cycle. Then, a counter output signal will appear at the counter output $a2$, and so forth, until finally a counter output signal appears at the counter output $a16$. The counter output signal appearing at the counter output $a16$ is the last counter output signal within each counting cycle. After the appearance of the last counter output signal, a counter output signal reappears at the counter output $a1$ at the start of the next counting cycle. The counter output signals at the individual counter outputs may each have the same duration as each of the clock pulses emitted by the clock generator C1. Moreover, they may have a duration different from that of the bits of the PCM digital signals which appear on the circuits PCMan and PCMab.

During the appearance of counter output signals at the counter outputs $a1$ to $a4$, the digital signal applied to the input register Reg1 is converted into an analog signal. Then, an analog signal emitted from the transmitting unit of the associated telephone station $Tn$ is converted into a digital signal. The conversion of the digital signal into an analog signal which shall be applied to the receiving unit of the associated telephone station $Tn$ takes place within a first subinterval in the ongoing counting cycle. The conversion of an analog signal into a digital signal occurs within a second subinterval in the ongoing counting cycle, said second subinterval immediately following the first subinterval.

With the appearance of a counter output signal at the counter output $a15$ and AND elements G21 to G28 are actuated. As a consequence, the bits emitted by the bistable multivibrators FF1 to FF8 are written into the register stages of the output register Reg2. Thus, the digital signal corresponding to the analog signal emitted from the transmitting unit of the telephone station $Tn$ is available for transmission over the circuits PCMab to a signal receiving unit. This receiving unit together with the signal output device mentioned above forms a part of a PCM switching center. The receiving unit may, for example, include a channel time slot pulse frame storage for incoming interexchange traffic. The signal output device may, for example, likewise include a channel time slot pulse frame storage but for outgoing interexchange traffic.

The last mentioned digital signal could also be supplied to the highway PCMab without bubbering in the output register Reg2. The AND elements G21 to G28 could have their inputs connected to the counter $Ct$ in such a manner that they would be actuated one after another for the duration of a digital signal. The outputs of these AND elements could be combined over an OR element connected to the circuits PCMab. In any event, this digital signal is transferred via circuit PCMab when clock pulses are applied from the output $o2$ of the pulse gathering circuit $Ts$ to the clock inputs of the register stages of the output register Reg2. This is the case when, as explained hereinabove, a digital signal to be converted into an analog signal is applied at the input end to the pulse gathering circuit $Ts$. However, before said transmission of the digital signal via circuit PCMab takes place, the counter $Ct$ supplies from its output $a16$ a "1" counter output signal through which the bistable multivibrator KS is switched over to its reset condition. In this reset condition, the "1" signal that closes the switch S1 is no longer applied to the enabling input of said switch connected to said bistable multivibrator KS. As a result, the counter $Ct$ no longer receives clock pulses from the clock generator C1. The switch S1 is closed only after the pulse gathering circuit $Ts$ again delivers a "1" signal from its output $o1$ and thereafter the bistable multivibrator KS again reaches its set status, whereupon the counter Ct restarts a new counting cycle within which it passes through all counter positons. Thus, the operation of the switching arrangement under consideration is synchronized to the operation of the signal output unit supplying digital signals or, as the case may be, to the operation of the signal receiving unit accepting digital signals, that is, by use of the channel time slot pulses of the channel time slot pulse train allocated to the telephone station Tn associated with the switching arrangement considered so as to accept signals from the signal output unit and, where necessary, to supply signals to the signal receiving unit.

The counter Ct remains in its initial position when no digital signals appear on circuit PCMan. To cancel any signals still present in the input register Reg1 and in the output Reg2, one may reset the register stages of said registers. A special reset signal may be supplied by the telephone station Tn when upon expiration of a given interval no further analog signal arrives in said telephone station Tn. This signal could be emitted over a switch contained in the telephone station Tn, said switch being capacitively connected to the reset inputs of the register stages of said registers for supplying a "1" reset pulse to said reset inputs upon expiration of said interval.

As explained hereinabove, the counter Ct of the switching arrangement shown in FIG. 1 is put into operation only to carry out a counting process — by applying clock pulses from the clock generator C1 when a digital signal to be converted into an analog signal appears on the circuit PCMan. In other words, the analog-to-digital converter is intentionally put into operation only with a view to converting digital signals into analog signals and analog signals into digital signals when digital signals are applied by the signal output device for conversion into analog signals. If one desires to convert analog signals from the telephone station Tn and deliver them as digital signals, the, in order to be able to put the analog-to-digital converter into service, one has to wait until digital signals are applied by the signal output device for conversion into analog signals which digital signals are intended for the particular telephone station Tn. Thus, by way of example, by emitting digital signals from a switching center to which the telephone station involved is connected by its analog-to-digital converter, one may determine when communication signals shall be supplied by telephone station Tn.

Assuming that the "1" bits of the circuit PCMan are represented by positive pulses and the "0" bits by negative pulses, the pulse gathering circuit Ts may comprise, for example, a monostable circuit and a diode connected in parallel for supplying a control signal at the output o1 and, on the other hand, a series connection of an inverter and a diode biased in the same forward direction for the supplying of control pulses at the output o2. The monostable circuit whose input would be connected to the circuit PCMan then would have an operating time (unstable condition) equal to the desired duration of a control signal. The aforesaid parallel connection would be connected between the circuit PCMan and the output o2.

The switching arrangement shown in FIG. 2 has already been described with reference to FIG. 1 with respect to the analog-to-digital converter and the associated telephone station Tn. Thus, it is not necessary to detail the construction of these circuit elements.

Figure 2:
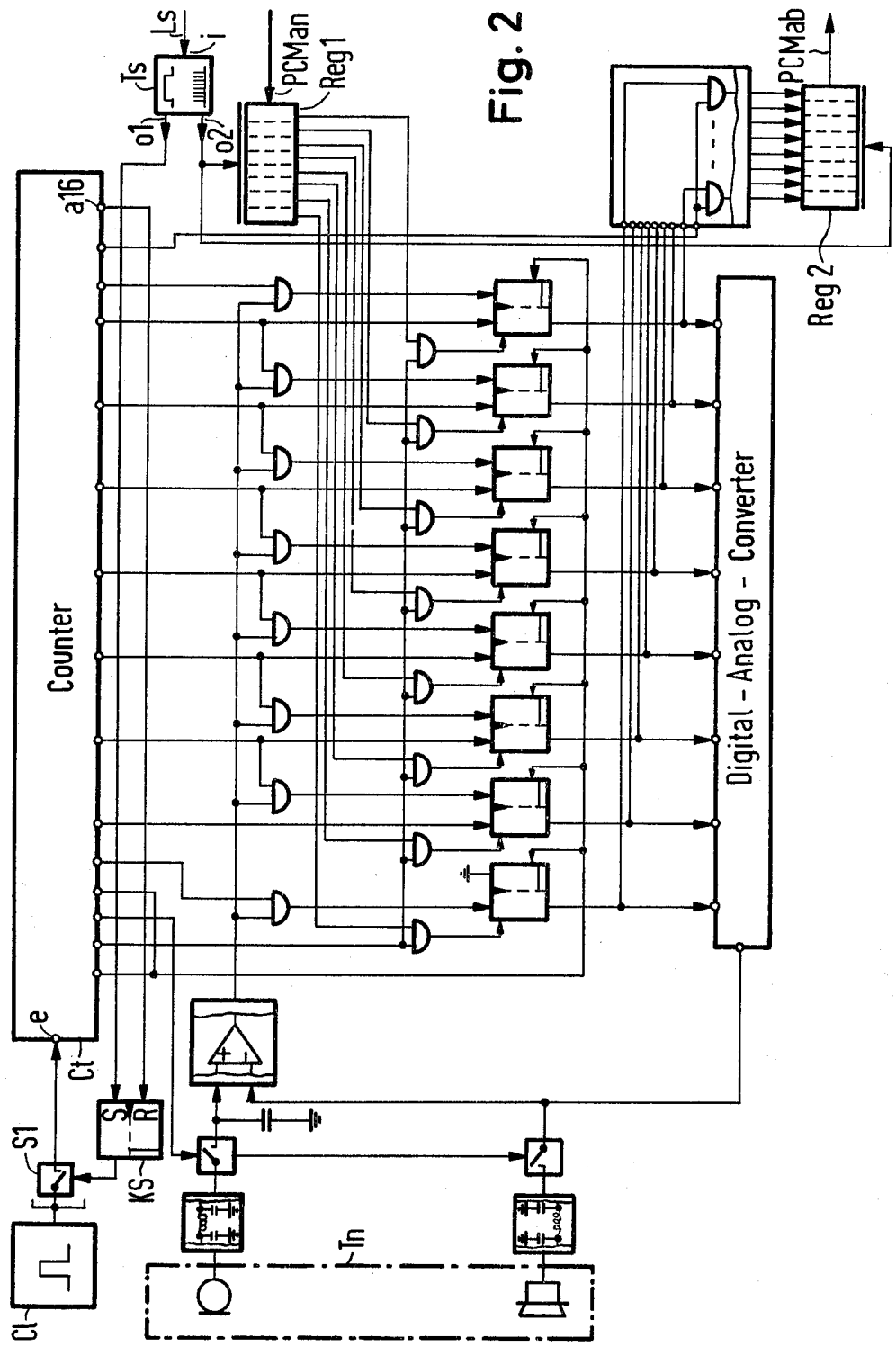
FIG. 2 is a modification of the switching arrangement of FIG. 1 incorporating different input connections.

The switching arrangement illustrated in FIG. 2 differs from that of FIG. 1 only in that the pulse gathering circuit Ts — which may be structured like the pulse gathering circuit provided in the switching arrangement of FIG. 1 — is not connected at the input end to the circuit PCMan carrying digital signals to be converted into analog signals. Its input i is connected to a special control lead Ls. The pulses of the channel time slot channel time slot pulse train intended for the telephone station Tn appear on said control lead Ls. The pulse gathering circuit Ts derives from said channel time slot pulses a control signal which it delivers from its output o1 to the set input S of the bistable circuit KS. The output of bistable circuit KS is connected to the operating input of the switch S1 for actuating switch S1 during the set status ("1" status) of the output signal. The switch S1 connects the input e of the counter Ct of the analog-to-digital converter to the output of the clock generator C1. The aforesaid control signal may have a duration corresponding to the duration of one of the pulses appearing on the control lead Ls.

The pulse gathering circuit Ts delivers at its output o2 clock pulses in response to each of the channel time slot pulses appearing at its input i in a number corresponding to the number of bits making up a digital signal. Said clock pulses are used to control the register stages of the input register Reg1 and the output register Reg2 which latter register is connected to the circuit PCMab.

Due to the transmission of the channel time slot pulses of a channel time slot pulse train intended for the telephone station Tn and, where necessary, the delivery of signals over the special control lead Ls, the digital signals to be converted into analog signals are applied in some code on the circuit PCMan.

Figure 3:
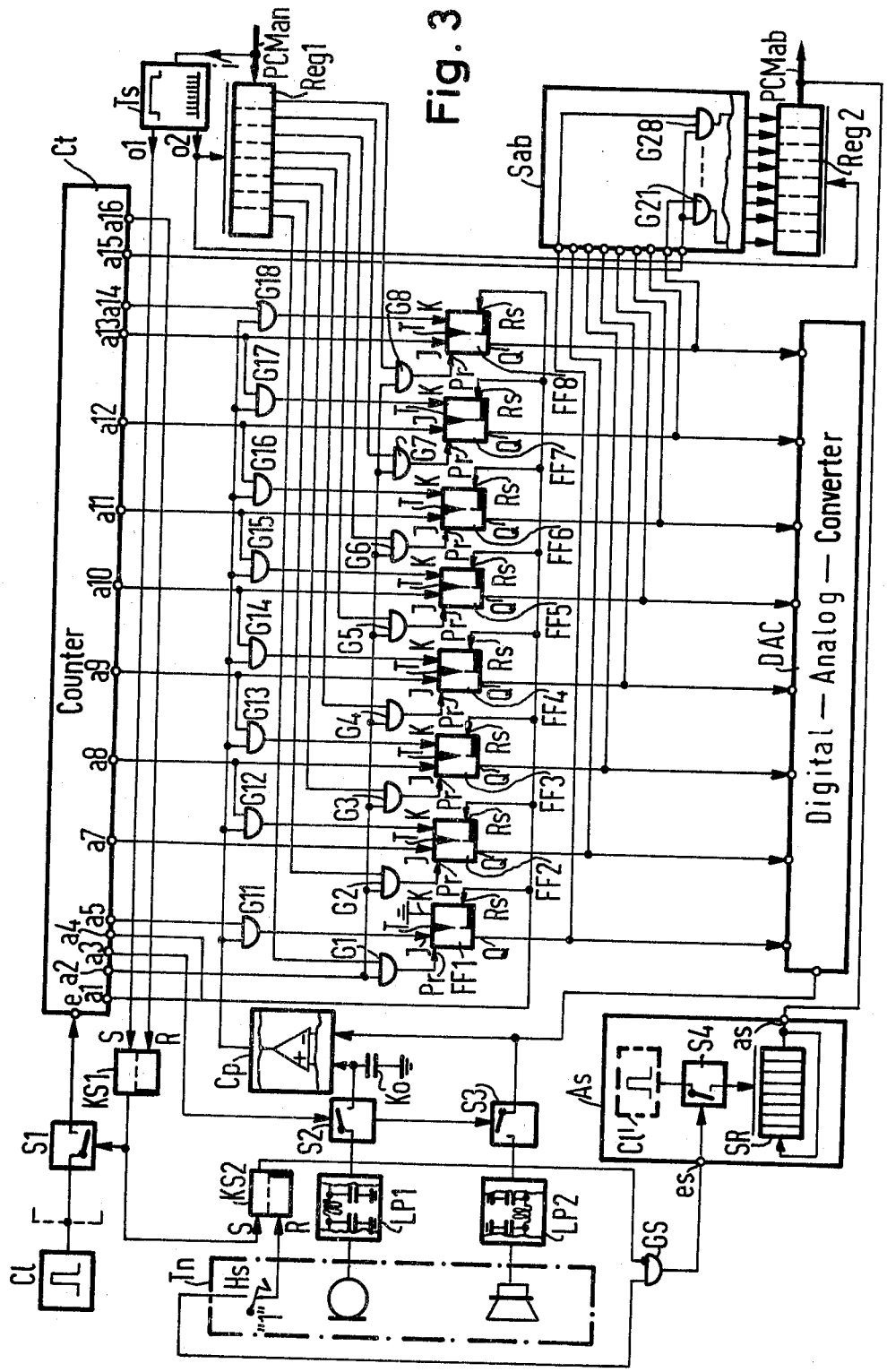
FIG. 3 is a further modification of the switching arrangement of FIG. 1 incorporating a telephone station request circuit.

In FIG. 3, the circuit components corresponding to those of FIG. 1 are marked with the same reference symbols as in FIG. 1. The circuit arrangement illustrated in FIG. 3 differs from that of FIG. 1 essentially in that there is also provided a request signal output circuit As which in this case contains a shift register SR connected as a circulating store for producing a bit sequence which represents the request signal contained in said shift register SR. This shift register SR thus has a number of register stages corresponding to the number of bits making up the request signal, the output of the last register stage being connected to the input of the first register stage of the shift register SR. The clock inputs of the register stages of the shift register SR are all connected over a switch S4 to the output of a clock generator labeled clock generator C1'. It should be noted that said clock generator may be a special clock generator. However, the clock generator C1 mentioned earlier may likewise be employed instead of the clock generator C1'. In this case, the switch S4 would be connected directly to the output of the clock generator C1.

The input of the request signal output circuit As to which the operating input of the switch S4 is connected is connected to the output of a blocking element GS. The signal input of the blocking element GS is connected to the normally-open contact of the normally-open selector switch Hs associated with the telephone station Tn. The selector switch Hs, which may be a cradle switch, delivers a "1" signal to its normally open contact only when the telephone station Tn is in the transmission mode, that is, it is ready to deliver analog signals and, where necessary, to receive analog signals.

The blocking input of the blocking element GS is connected to the output of a bistable circuit KS2. The output of this bistable circuit KS2 carries a "1" signal only when this circuit KS2 is in the set status. The set input of the bistable circuit KS2 is connected to the output of a bistable circuit KS1 (which corresponds to the bistable circuit KS shown in FIGS. 1 and 2). Bistable circuit KS1 is connected to the operating input of the swtich S1 for connecting the output of the clock generator C1 to the input e of the counter Ct. The reset input R of the bistable circuit KS2 is connected to the normally-closed contact of the cradle switch Hs.

The output (as) of request signal output circuit As, which comprises the output of the shift register SR, is connected directly to the circuit PCMab.

Having described the basic construction of the switching arrangement shown in FIG. 3, we shall now consider its operation, but only to the extent that it differs from the operation of the switching arrangement of FIG. 2.

Let it be assumed that the telephone station Tn is in the idle condition where the cradle switch Hs is in the position shown in the drawing. It is further assumed that the telephone station Tn is not yet assigned a channel time slot pulse train with recurring channel time slot pulses in successive cycles. This means that the counter Ct has not yet been put into operation. Now, if the telephone station Tn is switched to its operating condition, that is, it is ready to deliver analog signals and, where necessary, to receive analog signals, then the cradle switch Hs is placed in its operating condition. A "1" signal is applied to the signal input of the blocking element GS. At this time, since the bistable circuit KS2 is still in its reset condition, a "0" signal is applied to the inhibiting input of the blocking element GS. The "1" signal appearing at the output of the blocking element GS causes the switch S4 of the request signal output circuit As to close. The clock pulses are now applied to the clock inputs of the register stages of the shift register SR. Consequently, a shift operation takes place in the shift register SR, in response to which the request signal bit sequence appears (sometimes repeatedly) on the circuit PCMab.

The request signal bit sequence causes — e.g. in a switching center to which the switching arrangement considered is connected over the circuits PCMan and PCMab — a channel time slot pulse train with recurring channel time slot pulses in successive cycles to be allocated to the telephone station Tn. In the present case, this channel time slot pulse train may appear on the circuit PCMan. In response to the first appearance of a channel time slot pulse of such channel time slot pulse train, the pulse gathering circuit Ts connected at the input end to the circuit PCMan emits a "1" signal at output o1. Thus, the bistable circuit KS1 is set, closing the switch S1. Furthermore, the bistable circuit KS2 is set. The closing of the switch S1 initiates the counting cycle of the counter Ct which, upon reaching its last counter position, causes the application of a reset signal to the reset input R of the bistable circuit KS1. The bistable circuit KS1 reaches its reset status in response to said reset signal, whereupon the switch S1 is brought to its open position. Only after the appearance of a further channel time slot pulse of the channel time slot pulse train intended for the telephone station Tn does the bistable circuit KS1 again reach its set status and close the switch S1, whereas the other bistable circuit KS2 remains in the set status as long as the telephone station Tn is in the transmission mode, that is, it is ready to supply analog signals. In this condition, the "1" signal applied to the bistable circuit KS2 to the inhibiting input of the blocking element GS prevents the blocking element GS from delivering further "1" signals. As a result, the switch S4 of the request signal output circuit As is opened and no further request signal bits are supplied to the circuit PCMab.

In response to the allocation of a channel time slot pulse train with recurring channel time slot pulses in successive cycles, the analog-to-digital converter associated with the telephone station Tn now performs its conversion tasks as described previously with respect to FIGS. 1 and 2. However, in accordance with the previous assumptions the conversion tasks associated with request signal output circuit As of FIG. 3 include only the task of converting analog signals into digital signals. If digital signals are applied to the circuit PCMan intended for the telephone station Tn, these digital signals are converted into analog signals as described with reference to FIGS. 1 and 2.

It should also be noted that it may come to pass that the bits supplied during the operation of the request signal output circuit As from its shift register SR to the circuit PCMab do not appear immediately in the sequence of the request signal bit sequence. However, this does not prevent the detection of the correct request signal bit sequence in an interpreter circuit of a signal receiving unit connected to the circuit PCMab. For example, in said signal interpreter circuit the bits concerned could be applied to a shift register whose register stages are connected at the output end to inputs of a logic element which emits an output signal leading to the allocation of a channel time slot pulse train only if the particular specified request signal bit sequence has been detected.

It is further noted that in addition to the circuit components mentioned hereinabove, the telephone station Tn may also comprise a display device, e.g. a display lamp, to which is applied the signal fed to the inhibiting input of the blocking element GS. The flashing of the display device would then indicate that one can initiate the signal output from the telephone station Tn.

The construction of the analog-to-digital converter and the associated telephone station Tn of the switching arrangement shown in FIG. 4 was already discussed in connection with FIG. 1. Thus, these circuit components need not be detailed herein.

In addition to the circuit components mentioned hereinabove, the switching arrangement shown in FIG. 4 has circuit elements which apply a working supply voltage to the analog-to-digital converter and its associated telephone station only upon the appearance of digital signals to be converted into analog signals. This may be accomplished by the appearance of a particular prespecified call signal bit sequence directly on the incoming circuit PCMan and/or indirectly through the telephone station Tn associated with the analog-to-digital converter when it is switched from its idle state to its operating state. To this end, a detector circuit Det is connected with its inputs to the outputs of the register stages of the input register Reg1. Said detector circuit Det which emits a "1" output signal upon the appearance of a particular prespecified call signal bit sequence is connected with its output to an input of an OR element G. The other input of OR element G is connected to the normally-open contact of a selector switch Hs associated with the telephone station Tn. The selector switch Hs may be a cradle switch of the telephone station Tn, which may be in the position shown in the drawing during the idle condition of the telephone station Tn and which may be in its other position during the operating condition of the telephone station Tn. The cradle switch Hs delivers a "1" signal during the idle condition to its normally-closed contact and during the operating condition to its normally-open contact.

The output of OR element G is connected to the set input S of a bistable circuit FF. The reset input R of the bistable circuit FF is connected through an isolating capacitor Kr to the normally-closed contact of the cradle switch Hs. The output Q of the bistable circuit FF which carries a "1" signal during its set status is connected with the operating input of a switch Su. Switch Su connects a supply voltage input e3 of the switching arrangement comprising the analog-to-digital converter and the telephone station Tn associated therewith to a working supply voltage generator UB. In the present case, said working supply voltage generator UB supplies the working supply voltage for the analog-to-digital converter and the telephone station Tn associated therewith.

The detector circuit Det which has a supply voltage input e2, the input register Reg1 which has a supply voltage input e1 and the pulse gathering circuit Ts which is connected at the input end to the incoming highway PCMan and which has supply voltage input e4 are all connected directly to the working supply voltage generator UB. As a result, when the switch Su is in the open position, only the detector circuit Det, the input register Reg1 and the pulse gathering circuit Ts receive a supply voltage. This results in a low current consumption during the idle condition of the switching arrangement.

Having described the construction of the switching arrangement shown in FIG. 4, to the extent necessary for understanding the invention, its mode of operation will now be discussed.

Let it first be assumed that the switching arrangement is in the idle condition, that is, the cradle switch Hs of the telephone station Tn occupies the position shown in the drawing. Let it further be assumed that no digital signals appear on the incoming circuit PCMan and that there is no call signal bit sequence. This causes the switch Su to remain open.

Now, when a call signal bit sequence appears on the incoming circuit PCMan resulting in the emission of a "1" control signal by the detector circuit Det and/or the telephone station Tn reaches its operating condition resulting in the switching over of the cradle switch Hs, the OR element G emits a "1" signal. Thus, the bistable circuit FF is set and the switch Su closes causing the working supply voltage to be connected over the voltage supply input e3 to the circuit arrangement (through the element enframed by a dashed line in the drawing). The appearance of the aforementioned call signal bit sequence further causes the pulse gathering circuit Ts to deliver a "1" signal from its output o1 to the set input S of the bistable circuit KS causing it to be set. This results in the closing of the switch S1 which is connected to one output of the bistable circuit KS. Clock pulses from the clock generator Cl are then transmitted to the input e of the counter Ct. The pulses appearing at the output o2 of the pulse gathering circuit Ts carry out the control tasks in the input and output registers as described above. The necessary conversion processes can now be initiated in the analog-to-digital converter.

When the telephone station Tn is switched over from its operating condition to its idle condition, the cradle switch Hs of the telephone station Tn again goes to the position shown in the drawing. Among other things, this causes a "1" pulse to find its way to the reset input R of the bistable circuit FF over the capacitor Kr. As a result, the bistable circuit FF is reset, causing the switch Su to reopen. This disconnects the output of supply voltage from the input e3 of the switching arrangement of the analog-to-digital converter and the telephone station Tn associated therewith; the switching arrangement is thus again in its current-saving starting condition.

Figure 4:
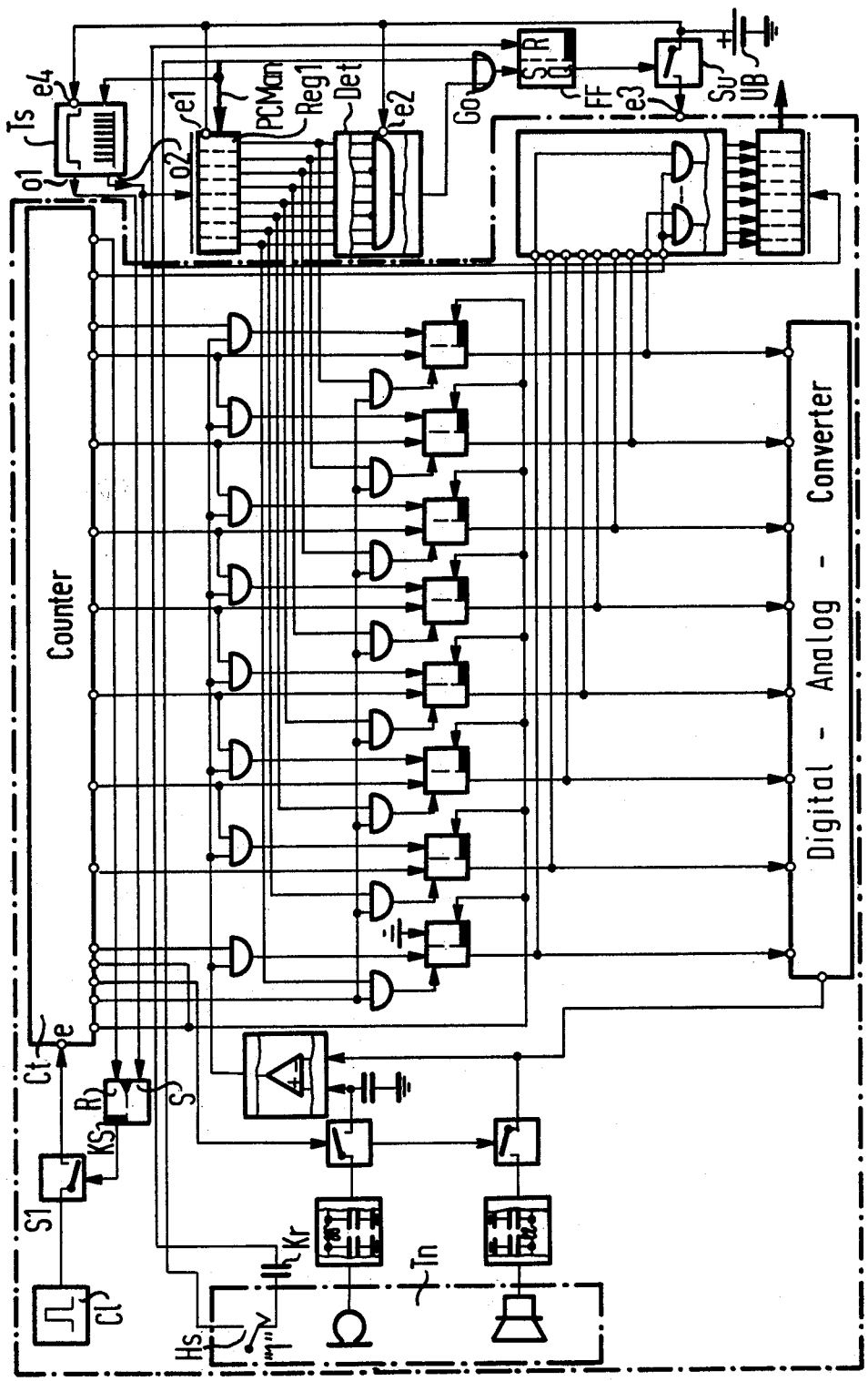
FIG. 4 is another modification of the switching arrangement of FIG. 1 incorporating a power saving circuit.

Finally, it should be noted that the above described construction of the switching arrangement illustrated in FIG. 4 may be modified. The set input S of the bistable circuit FF could be connected to the output of an AND element coupled with one input to the normally-open contact of the cradle switch Hs of the associated telephone station Tn and with its other input coupled to the output of the detector circuit Det.

We claim:

1. A method of converting incoming PAM analog signals into outgoing PCM digital signals, and of converting incoming PCM digital signals into outgoing PAM analog signals in a telecommunication installation having telephone stations, each of said telephone stations comprising a transmitting unit supplying analog signals and a receiving unit accepting analog signals, wherein said telecommunication installation communicates with a PCM switching center by supplying PCM digital signals to said PCM switching center and receiving PCM digital signals from said PCM switching center, said telecommunication installation being in communication with said PCM switching center for the duration of the channel time slot pulses of the PCM channel time slot pulse train, said telecommunication installation comprising an analog-to-digital converter for the conversion of the incoming PAM analog signals into outgoing PCM digital signals, said analog-to-digital converter functioning according to the iterative principle and comprising a counter with a given counting interval, an intermediate register controlled by the outputs of said counter, a digital-to-analog converter following said intermediate register, and an analog comparator with one input connected to the output of said digital-to-analog converter and another input connected to receive analog signals from said transmitting unit which are intended to be converted into digital signals, the output signals of said comparator being supplied to said intermediate register, said telecommunication installation further comprising digital signal converting means including said intermediate register and said digital-to-analog converter for converting incoming PCM digital signals to outgoing PAM analog signals and sending the converted PCM digital signals to said receiving unit of said telephone station, the method comprising the steps of:

sharing the counting interval of said counter by converting the PCM digital signal from said PCM switching center to a PAM analog signal during a first portion of the counting interval of said counter and by converting the PAM analog signal from said transmitting unit of said telephone station to a PCM digital signal during a second portion of the counting interval of said counter; and, initiating the counting interval of said counter within which said counter passes through all counter positions upon the appearance of each channel time slot pulse of the PCM channel time slot pulse train from said PCM switching center.

2. The method as set forth in claim 1 further comprising the step of actuating the counter by clock pulses of such frequency that the duration of the counting cycle of the counter is smaller than the period of the channel time slot pulses of the PCM channel time slot pulse train allocated to said telephone station.

3. The method as set forth in claim 1 further comprising the step of initiating the counting interval of said counter over a special control lead independently of the PCM channel time slot pulse train.

4. The method as set forth in claim 1 further comprising the step of requesting said PCM switching center to supply a PCM channel time slot pulse train to initiate the counting interval of said counter upon the appearance of a PAM analog signal at the transmitting unit of said telephone station for conversion to a PCM digital signal by said telecommunication installation.

5. The method as set forth in claim 1 further comprising the step of connecting the working supply voltage to said telecommunication installation only upon the appearance of a special instruction derived from the presence of the PCM channel time slot pulse train from said PCM switching center or the presence of PAM analog signal in said telecommunication installation which is available for conversion.

6. In a telecommunication installation having telephone stations, each of said telephone stations comprising a transmitting unit for supplying PAM analog signals and a receiving unit for receiving PAM analog signals, a conversion circuit connected between said telephone station and a PCM switching center for converting the PAM analog signals supplied by said telephone station into outgoing PCM digital signals and for converting incoming PCM digital signals into PAM analog signals for said telephone station, wherein said conversion circuit communicates with said PCM switching center by supplying PCM digital signals to said PCM switching center and receiving PCM digital signals from said PCM switching center, said conversion circuit being in communication with said PCM switching center for the duration of the channel time slot pulses of the PCM channel time slot pulse train of the incoming PCM digital signal, said conversion circuit comprising:

an input register for receiving and temporarily storing PCM digital signals from said PCM switching center;

a multistage counter with a given counting interval;

a clock pulse generator connected to said counter for enabling said counter to pass through all its counter positions in response to the appearance of each channel time slot pulse of the PCM channel time slot pulse train received by said input register from said PCM switching center;

intermediate register means;

a first logic circuit connected to the outputs of said input register and actuated by said counter for coupling the incoming PCM digital signal from said input register to said intermediate register means in accordance with a first portion of the given counting interval of said counter;

a digital-to-analog converter connected to said intermediate register means for converting the PCM digital signal in said intermediate register means to an analog signal within the first portion of the given counting interval and supplying the analog signal to said receiving unit of said telephone station;

an analog comparator with one input connected to receive the PAM analog signal from said transmitting unit of said telephone station and a second input connected to the output of said digital-to-analog converter;

a second logic circuit connected to the output of said analog comparator and actuated by said counter for coupling the PAM analog signal from said transmitting unit of said telephone station to said intermediate register means and said digital-to-analog converter to convert the PAM analog signal to an outgoing PCM digital signal in accordance with a second portion of the given counting interval of said counter by the combined operation of said analog comparator, said second logic circuit, said counter, said intermediate register and said digital-to-analog converter; and an output register connected to the outputs of said intermediate register means for coupling the outgoing PCM digital signal to said PCM switching center.

7. In the conversion circuit according to claim 6, wherein the duration of the given counting interval of said counter is smaller than the period of the channel time slot pulses of said PCM channel time slot pulse train allocated to said telephone station.

8. In the conversion circuit according to claim 6, wherein said conversion circuit further comprises: pulse gathering means connected to receive the PCM channel time slot pulse train from said PCM switching center, said pulse gathering means generating a control signal upon the appearance of said PCM channel time slot pulse train; bistable multivibrator means connected to said pulse gathering means for changing states in response to the control signal from said pulse gathering means; and a switch responsive to said bistable multivibrator for connecting said clock generating means to said counter to actuate said counter, said counter including a reset output for resetting said multivibrator to open said switch at the end of the counting interval.

9. In the conversion circuit according to claim 8, wherein said pulse gathering means further comprises an output connected to said input register and said output register for setting said input and output registers upon the appearance of the PCM channel time slot pulse train from said PCM switching center.

10. In the conversion circuit according to claim 8, wherein said pulse gathering means further comprises a special control input for actuating said pulse gathering means independently of the PCM channel time slot pulse train from said PCM switching center.

11. In the conversion circuit according to claim 10, wherein said conversion circuit further comprises request signal means connected between said telephone station and said PCM switching center for requesting said PCM switching center to allocate and transmit a PCM channel time slot pulse train to said conversion circuit when no PCM digital signals appear at said conversion circuit and said transmitting unit of said telephone station desires to transmit a PAM analog signal, said counter being actuated only upon the appearance of a PCM channel time slot pulse train from said PCM switching center.

12. In the conversion circuit according to claim 11, wherein said request signal means comprises: a request signal output circuit for supplying a request signal bit sequence to said PCM switching center; and a blocking element for actuating said request signal output circuit, said blocking element having a first input connected directly to said telephone station responsive to the operating state of said telephone station, said blocking element having a second input connected to a request multivibrator which is responsive to the condition of said counter to thereby enable said request signal output circuit in the event said telephone station is prepared to send a PAM analog signal to said conversion circuit and said counter is not operating.

13. In the conversion circuit according to claim 12, wherein said request multivibrator comprises a reset means for resetting said request multivibrator in the event said telephone station is not prepared to send a PAM analog signal to said conversion circuit to thereby prevent said blocking element from actuating said request signal output circuit.

14. In the conversion circuit according to claim 13, wherein said request signal means further comprises an indicator means connected to said second input of said blocking element for indicating whether the request signal means can be actuated by said telephone station.

15. In the conversion circuit according to claim 6, wherein said conversion circuit further comprises voltage control means connected to both said input register and said telephone station for disconnecting the voltage supply from the remainder of said conversion circuit in the event no PCM channel time slot pulse train appears at said input register and no PAM analog signals are available at said telephone station for conversion in said conversion circuit, said voltage control means receiving a special instruction to connect said voltage supply when the PCM channel time slot pulse train and PAM analog signals are available.

16. In the conversion circuit according to claim 15, wherein said voltage control means comprises: detector means connected to said input register for detecting the presence of a PCM channel time slot pulse train from said PCM switching center; a power bistable means with a set input connected to said detector means and said telephone station; and a power switch responsive to the set input of said power bistable means for connecting said voltage supply and the remainder of said conversion circuit in the event a PCM channel time slot pulse train from said PCM switching center appears or in the event said telephone station is in the operative condition, said power bistable means also having a reset input connected to said telephone station for resetting said power bistable means in the event said telephone station is in the inoperative condition.

* * * * *